United States Patent [19]

Jargiello et al.

[11] 4,363,176
[45] Dec. 14, 1982

[54] ANTIBUCKLING APPARATUS FOR LITHOGRAPHIC PRINTING PLATES

[75] Inventors: Paul Jargiello, Orange, N.J.; William Bosshardt, Armonk, N.Y.

[73] Assignee: Polychrome Corporation, N.Y.

[21] Appl. No.: 252,739

[22] Filed: Apr. 10, 1981

[51] Int. Cl.³ .......................... F26B 23/04; F26B 3/30
[52] U.S. Cl. .............................................. 34/4; 34/41; 118/642
[58] Field of Search ....................... 34/4, 41, 155, 160; 118/642, 643; 427/54.1, 55

[56] References Cited

U.S. PATENT DOCUMENTS

| 3,340,618 | 9/1967 | Bentzman | 118/642 |
| 3,930,318 | 1/1976 | Stelter et al. | 34/4 |
| 3,973,328 | 8/1976 | Theobald | 34/4 |

*Primary Examiner*—Larry I. Schwartz

[57] ABSTRACT

The disclosure concerns an antibuckling apparatus for a lithographic plate or the like which is being cured in a UV post-curing apparatus. A source of UV radiation irradiates one surface of the plate as the plate is moved through a curing chamber along a predetermined path. An upper antibuckling device comprises a first pair of spaced elongated members which extend across the path of the plate and serve as a support for a plurality of upper antibuckling bars disposed between the radiation source and the upper surface of the plate. The antibuckling bars are disposed generally along the path of the plate but obliquely to the direction of the path, whereby the antibuckling bars do not interfere with irradiation of the entire width of the upper surface of the plate. A similar lower antibuckling device may be disposed beneath the plate on the side thereof not being irradiated. A respective pair of plate moving rollers is disposed inside the curing chamber respectively near the entrance and the exit thereto and they also block emission of radiation from the curing chamber.

19 Claims, 4 Drawing Figures

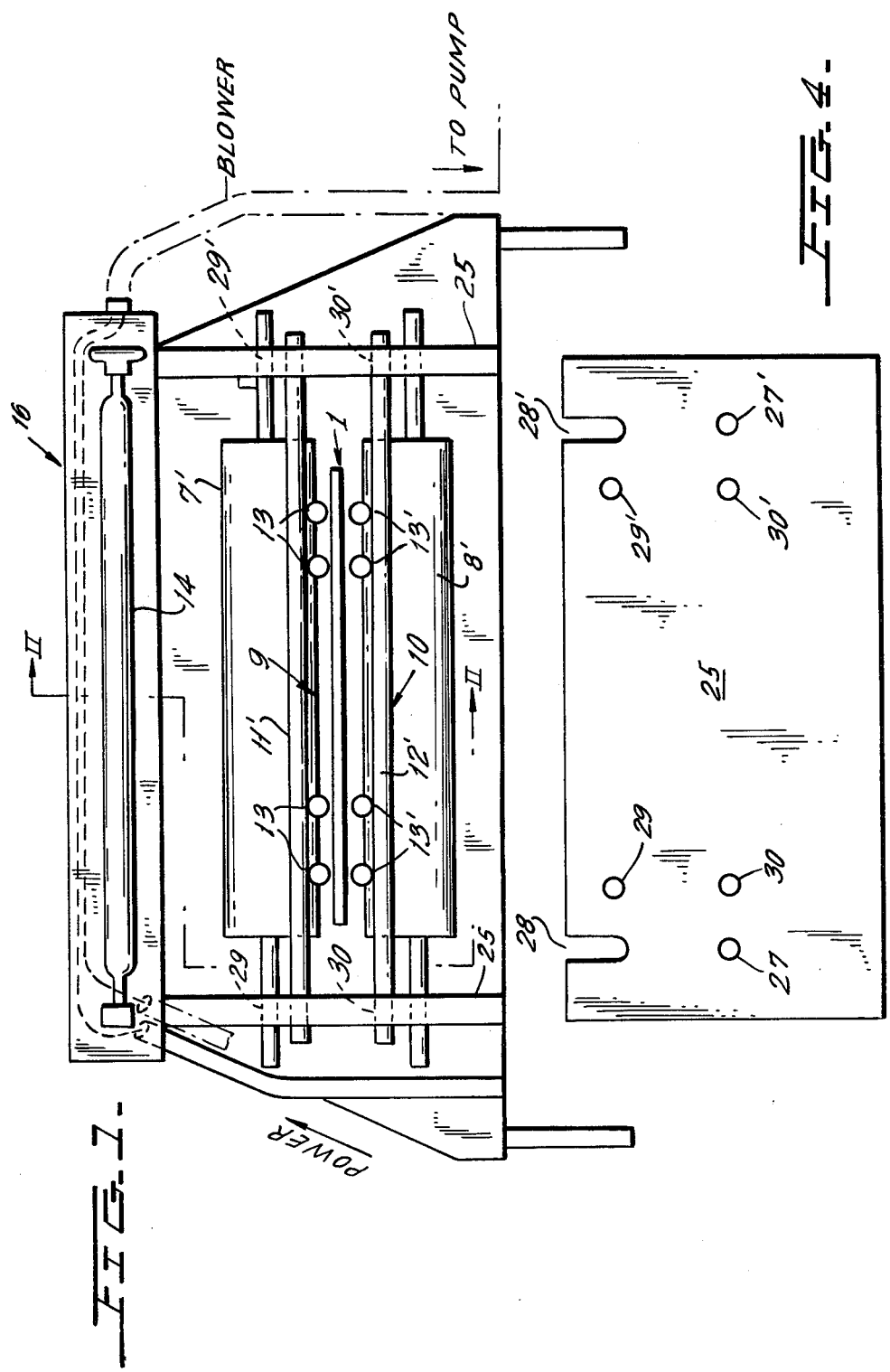

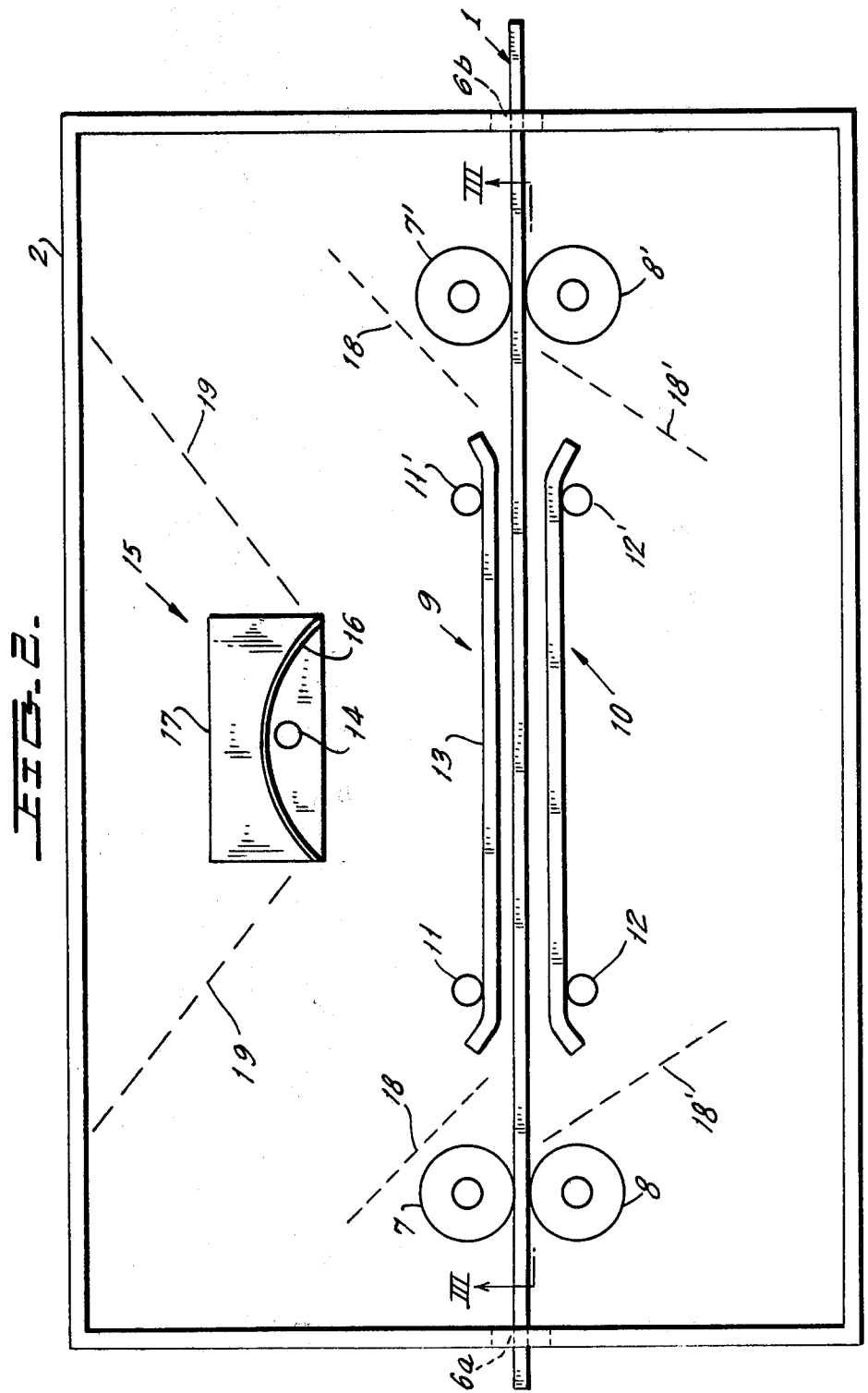

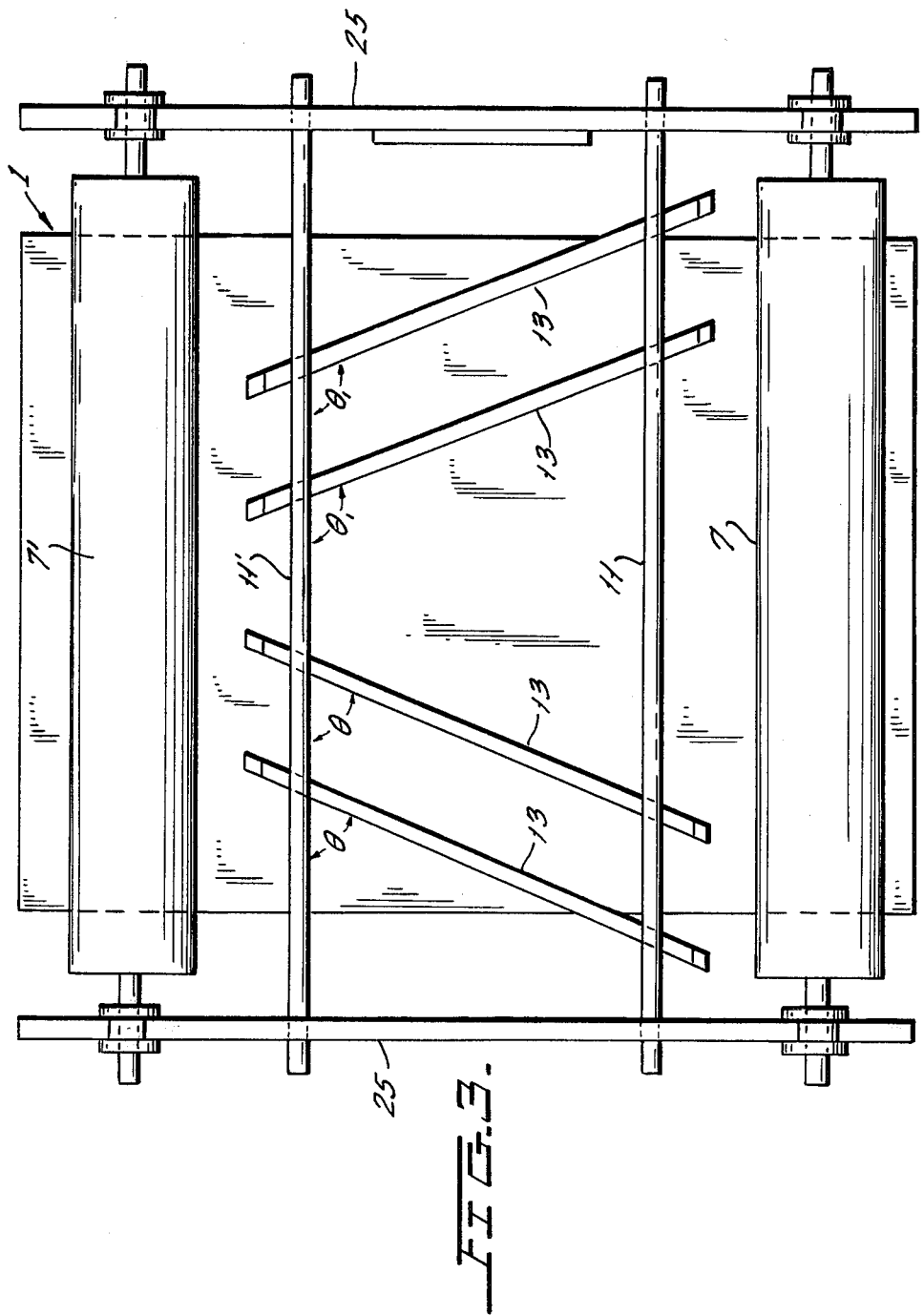

ANTIBUCKLING APPARATUS FOR LITHOGRAPHIC PRINTING PLATES

BACKGROUND OF THE INVENTION

This invention relates to lithographic printing plates. More particularly, it relates to an improved antibuckling apparatus for post-curing lithographic printing plates by exposure to high intensity radiation for short periods of time.

Lithographic printing plates are characterized by the fact that they have printing or image areas and nonprinting or nonimage areas in the same plane, the image areas being oleophilic and hydrophobic and the nonimage areas being hydrophilic and oleophobic. In printing with such a lithographic plate, an oil-based ink adheres to the image areas but not to the nonimage areas. Although the ink may be transferred from the plate directly to a receptor surface using, for example, a direct rotary press, it is normally transferred from the plate to a blanket roll or cylinder and then to a receptor surface, the latter technique being termed offset printing.

Lithographic printing has been known and used for many years; and so-called "photolithography" has more recently become a widely used technique, replacing for many printing applications letterpress printing which requires the formation of a printing plate having the printing or image areas raised above the plate surface. The ability to form a lithographic plate using photographic techniques, rather than the laborious process of typesetting or the exacting process of forming raised durable, well-defined indicia in a relatively thick plate coating, has materially increased the scope and range of printing jobs performed by lithography and particularly by offset printing. With the advent of margin justifying word processing equipment, high-speed photography and improved lithographic plates, offset printing has come to be used even in the printing of newspapers, books and the like where large numbers of copies are run.

In photolithography a thin coating of a photosensitive material is adhered to a plate which is generally of metal, although a plastic or special paper may be used for some special, limited applications. The metal plate is normally aluminum or zinc, or a combination of metal layers such as electrolitically deposited chromium on copper which may or may not be backed up with another metal such as steel or zinc to contribute strength and dimensional stability. The coatings on these plates are photosensitive in that upon exposure to radiation, e.g. light through the transparent areas of a photographic negative, they become insolubilized making it possible to remove the areas not so exposed with a suitable solvent to expose the plate surface. Thus the insolubilized areas become the image areas while the exposed plate areas become the nonimage areas.

The resulting plates usually retain residual radiation-sensitivity due to the relatively low doses of radiation applied during image-wise exposure. Among the disadvantages of plates prepared by this method are short press lives and low image durability.

The above problems have been obviated, in the past, by returning the image-wise exposed and developed plates to the imaging appartus for additional exposures to the imaging radiation for longer periods of time. This procedure has, inter alia, the disadvantage of tieing up the expensive, specialized imaging apparatus unnecessarily.

In my co-pending application Ser. No. 178,657, filed Aug. 15, 1980 now U.S. Pat. No. 4,326,018 there is described a method for overcoming the above disadvantages by post-exposing the developed plate to high intensity radiation for short periods of time. However, during such irradiation the temperature of the plate is greatly increased causing it to buckle, and the plate might jam and not be able to move further or the plate might contact the irradiation assembly which could damage that assembly or the plate.

U.S. Pat. No. 3,930,318, issued Jan. 6, 1976, describes a UV curing machine in which the radiation-heat induced buckling of the plate is minimized by a series of wires passing through the machine and maintained under tension. The wires pass through the space between the UV source and the plate, and portions of the presensitized plates directly under the wires are not exposed to radiation and, therefore, are not post-cured, thereby providing potential defects having the disadvantages described above.

SUMMARY OF THE INVENTION

Accordingly, it is the primary object of the present invention to permit post-curing of a lithography plate by irradiation while preventing buckling of the plate as it is heated.

It is another object of the invention to permit such post-curing without blocking radiation to any significant portion of the plate, especially measured across the path of movement of the plate through the housing.

It is a further object of the invention to prevent escape of radiation from the housing for the apparatus.

The instant invention provides a UV curing machine wherein excessive undesirable buckling is prevented without completely shielding any part of the plate from irradiation.

The invention provides an improved UV curing apparatus for post-curing developed lithographic plates. The apparatus includes an outer housing having an entrance opening at one side and an exit opening at the other side for permitting passage of the lithographic plate through the housing. The housing is enclosed conventionally to prevent escape of UV radiation. The outer housing encloses an irradiation assembly and that assembly comprises a second housing, an elongated UV radiation source disposed above one surface of the plate that passes through the housing and extending across, e.g. perpendicular, to the path of movement of the plate through the housing. Behind the UV radiation source is a radiation reflector for directing radiation emitted away from the plate back toward the plate. Other elements contained within the outer housing are appropriate means for moving the lithographic plate through the housing from the entrance to the exit. Conventional cooling means cool the irradiation source. Finally, according to the invention, there are upper antibuckling means above the upper surface of the plate, between the plate and the UV radiation source for preventing buckling of the plate as it is being irradiated and below the opposite lower side of the plate, there are lower antibuckling means also for preventing buckling of the plate.

The outer housing may be of any type known in the art, which housing is UV opaque. Examples of such housings are described in U.S. Pat. Nos. 3,829,982; 3,930,318; and 4,220,865. The housing is provided with conventional entrance and exit openings for the plate. Examples of conventional openings are the funnels of U.S. Pat. No. 3,930,318, the sleeves of U.S. Pat. No. 4,220,865, simple elongated lateral slots defined in the housing walls, etc. As UV radiation emitted from the housing may injure bystanders, such emission may be conventionally prevented, e.g. by shrouds covering the passage openings for the plate, as in U.S. Pat. No. 4,220,865; by baffles, or, as described further below, by the moving means described for moving the lithographic plate across and through the housing. Conventional means may move the plate through the housing, including conveyors, e.g. chains having dogs, as described in U.S. Pat. No. 3,930,318 or roller pairs in the housing for catching the plate at the nips of the cooperating rollers for moving the plate.

Baffles and shrouds which are used to prevent emission of radiation from the housing may contact the lithographic plate moving through the housing and may exert drag on the plate and on the coating thereof, resulting in defects in the plate and the print made therefrom. Thus, in the present invention, the moving means also comprises means for preventing emission of radiation.

Although the lithographic plate may be moved through the apparatus by any conventional means and even may be moved manually therethrough, it is desirable to move the lithographic plate in a manner which decreases the duration of the radiaton and the concurrent heat build-up and to move it regularly and smoothly. Thus, it is preferable to move the lithographic plate mechanically, e.g. by a motorized conveyor. According to the preferred embodiment of the invention, the moving means comprises at least one and preferably two pairs of cooperating, vertically displaced, generally horizontally oriented rollers, and each pair defines a respective horizontally oriented nip. The roller pairs cooperate for moving the plate through the housing. At least one of the rollers and preferably the upper roller of each pair is vertically movable to separate the rollers for permitting the passage of the plate between the rollers. The rollers of each pair are biased into contact with each other and are biased into contact with the plate passing through the nip. One roller pair is positioned near the plate entrance to the housing and the other roller pair is positioned near the plate exit. At least one of the rollers and preferably at least one of each pair of rollers is motor driven to rotate preferably at a constant speed for moving the plate through the housing. The cooperating non-driven roller of each roller pair would be driven by movement of the plate past that roller. The rollers in engagement with each other or with the plate passing through the nips block emission of UV radiation past the rollers and out the entrance or exit of the housing. The rollers may be of any type known in this art and are preferably fabricated of rubber or metal. It is preferred that larger rollers (i.e. those with greater than 32-inch axial length) be comprised of metal.

The irradiation assembly, including the UV radiation source, may be of any type known in the art, and particularly might include a tubular UV radiation source extending across the housing and across the path of movement of the plate, so that the entire width of the plate is irradiated. A concavely curved reflective surface is placed behind the UV source for reflecting escaping radiation back to the plate. The means for cooling the irradiation source and the entire apparatus conventionally might include means for generating an air flow around the radiation source and through the apparatus by known means, as described in the aforesaid patents, or may include liquid conduit cooling means, etc.

Since the plate driving rollers might be damaged by direct exposure to radiation and also to further ensure that radiation will not escape from the housing, baffles may be provided between the radiation source and at least some of the rollers to protect the rollers against direct exposure.

The upper antibuckling means for preventing radiation heating induced buckling of the lithographic plate is disposed between the UV radiation source and the upper surface of the plate which is to be irradiated. The upper anti-buckling means comprises a support for anti-buckling members. One example of such a support comprises a pair of bars which extend across the path of the plates through the housing, are above the plate, but are out of the path of the UV radiation toward the plate. One of these bars is closer to the entrance of the housing and the other is closer to the exit. They may be disposed horizontally. They are preferably oriented perpendicular to the path of movement of the plate through the housing. Means are provided for vertically adjusting the support bars as desired to increase or decrease the distance between the lower surface of the upper anti-buckling means and the upper surface of the plate.

The upper antibuckling means support has a plurality of elongated antibuckling members in the form of bars supported on the support for extending generally along the path of the plate through the housing and through the space between the UV source and the plate being irradiated. In the preferred embodiment, these antibuckling members are attached to and extend between the support bars, and particularly are attached at the undersides of these bars to enable them to be brought close to the surface of the plate, if desired. The anti-buckling bars are not oriented parallel to the path of the plate through the housing, i.e. they meet the support bars at angles with respect to the path of the plate through the housing and the support bars. The precise angles of the anti-buckling bars with respect to the path of the plate through the housing are not critical, except that the orientation of the anti-buckling bars is oblique to the path so that the antibuckling bars will not block irradiation of any longitudinally extending line at a location across the width of the plate. As the plate moves, the section thereof that is shaded by the anti-buckling bars shifts across the plate, so that all of the surface of the plate is irradiated, despite the presence of the anti-buckling bars in the path of the UV radiation. Preferably, the UV blocking antibuckling bars are disposed symmetrically across the path of the plate through the housing, so that the arrangement and orientation of half the anti-buckling bars at one side of the plate are the same as, but mirror-imaged with respect to, the arrangement and orientation of bars at the other side of the plate. Finally, the extreme ends of the anti-buckling bars are turned upward to prevent the ends of these bars from snagging the plate during its passage through the housing.

The lower anti-buckling means beneath the plate typically is not interposed between a UV radiation source and a surface of the lithographic plate. Thus, the considerations in the design of the upper anti-buckling means do not enter into the design of the lower anti-buckling means. The lower anti-buckling means may include a conveyor belt if a conveyor belt is used as the lithographic plate moving means, or may comprise wires, like those described in U.S. Pat. No. 3,930,318, which are disposed below the path of the lithographic plate or finally, it may comprise a metal plate disposed below the lithographic plate and that metal plate may be solid or perforated.

In a preferred embodiment of the invention, the lower anti-buckling means is substantially identical to the upper anti-buckling means. However, the lower anti-buckling bars could be disposed parallel to the path of movement of the plate through the housing, which is to be avoided for the upper anti-buckling means bars. The lower anti-buckling means is also vertically movable to increase or decrease the gap between the lower anti-buckling means bars and the lower surface of the lithographic plate.

Finally, as is conventional, power supplies, conduits, or plenums for electrical and air connections and a base to house the motor for driving the plate moving means and to house the power supplies are provided.

In practice, the plates are put through the apparatus at a rate in the range of about 2 to 10 feet per minute, preferably 4 feet per minute; the radiation source is disposed at a distance of about 4 to about 12 inches, preferably 6 inches, from the plate; and the intensity of said source is about 50 to about 250 watts per inch, preferably 200 watts per inch.

BRIEF DESCRIPTION OF THE DRAWINGS

A preferred embodiment of the invention is illustrated by the accompanying drawings in which:

FIG. 1 is an elevational, schematic view of the rear portion, absent the housing and frame, of the UV curing apparatus according to the present invention.

FIG. 2 is a side view of a section of the apparatus along the line II—II of FIG. 1.

FIG. 3 is a top view of a section of the apparatus along the line III—III of FIG. 2.

FIG. 4 is an elevational view of a support plate for elements of the apparatus.

DESCRIPTION OF THE PREFERRED EMBODIMENT

The drawings illustrate a UV curing apparatus for lithographic plate 1. The apparatus is enclosed by a UV radiation opaque housing 2. The housing has an inlet end opening 6a for the lithographic plate 1 at one end and has an outlet end opening 6b at the opposite end for the lithographic plate. The plate passes through the housing between the openings 6a and 6b.

The housing is hollow and defines a curing chamber in which the lithographic plate is irradiated. There are disposed along the opposite sides of the path of the plate through the housing a pair of parallel, upstanding support plates 25 which are spaced apart so that the moving means rollers 7, 8, 7', 8', described below, may be positioned between the plates 25 and the lithographic plate 1 may pass between them.

At the entrance end opening 6a to the housing, a first pair of vertically displaced, parallel, horizontally oriented elongated rollers 7, 8 are positioned and they define a horizontal nip between them. The rollers are positioned and oriented so as to generally align with the opening 6a so that a plate entering the opening 6a will easily travel to and through the nip of the rollers 7, 8. The rollers 7, 8 are supported on respective cores which are rotatably received and supported in the opening 28 for the upper roller 7 and the openings 27 for the roller 8 in the plates 25. The upper roller 7 is vertically displaceable by a lithographic plate moving between the rollers 7, 8. The opening 28 for the core for the roller 7 is thus a vertically elongated slot to permit the roller 7 to thus shift. Biasing means (not shown) may be provided for biasing the roller 7 toward the roller 8. At and just inside the exit end opening 6b from the housing 2, a similar set of upper and lower rollers 7', 8' are provided which are supported in openings 28' and 27', respectively, of plates 25' and are movable in the same way as rollers 7, 8.

The placement of the roller pairs 7 and 8 near the entrance opening 6a and the roller pair 7', 8' near the exit opening 6b serves to block a direct path of UV radiation past the roller pairs and out the entrance and exit.

After the lithographic plate has entered through the housing entrance 6a and has been moved between the entrance rollers 7, 8, the plate next passes between the upper antibuckling means 9, which is disposed between the UV radiation source and the upper surface of the plate and the lower antibuckling means 10, which is disposed beneath the lower surface of the plate. Once the plate has passed the irradiation means 14, it then is drawn between the rollers 7 ', 8' and then exits the housing through the exit 6b.

The upper anti-buckling means is comprised of a support comprising first pair of bars 11, 11' which are parallel to each other, extend perpendicular to the path of the plate through the housing and are received in the upper openings 29, 29' in the support plates 25. A plurality of elongated anti-buckling bars 13 are attached to the bottom surfaces of the support bars 11 and each bar 13 extends between the bars 11, 11', whereby the bars 13 are supported above the upper surface of the lithographic plate. The anti-buckling bars 13 are oriented generally along but obliquely to the path of the plate through the housing and meet the support bars 11 at an angle of other than 90°. As noted above, this assures that there is no longitudinally extending section of the plate at any location across the width of the plate which is caused to received diminished radiation or no radiation at all due to the presence of a bar 13 as an obstacle to passage of radiation to the plate upper surface. In FIG. 3, only four anti-buckling bars 13 are shown. But the number of such bars may be selected according to convenience of operation, strength and weight requirements. FIG. 3 shows the orientations of the anti-buckling bars 13 as being symmetric around the longitudinal center of the plate and shows all bars 13 at each side of the center line being oriented respectively parallel. However, the bars 13 may be oriented at any angle to the bars 13, except parallel to the path of the plate, and all bars may be parallel to each other or may be other than parallel, as a particular situation warrants.

The lower anti-buckling means 10 may be a mirror image of the upper one. However, since there is no radiation source acting on the lithographic plate 1 from below, the orientation of the anti-buckling bars on the lower anti-buckling mean is not critical and they may even be disposed parallel to the path of movement of the plate through the housing. The transverse support bars for the lower anti-buckling means are received in the lower holes 30, 30' in the side support plates 25.

As seen in FIG. 2, as the plate passes between the antibuckling means 9 and 10, it also passes beneath the irradiation apparatus which is disposed above the upper anti-buckling means 9. The irradiation apparatus 15 comprises a tubular source of UV radiation 14, which extends completely across the plate and is oriented perpendicularly to the path of the plate, a housing 17 for supporting the source of radiation and a concavely curved reflector 16 supported in the housing behind the radiation source 14 for reflecting any radiation hitting the reflector back toward the plate. The anti-buckling means 9, 10 assure that as the plate 1 is irradiated, buckling thereof is also prevented.

Once the plate 1 has been irradiated, it passes between the roller pairs 7', 8' and then exits through the exit 6b from the housing.

For protecting the rollers 7, 8 and 7', 8' from damage and to prevent them from being heated up, which might damage the plate contacted by the rollers, insulated baffles 18, 18' are disposed between the rollers, on the one hand, and the radiation source 14, on the other hand. In a further modification an additional set of insulated baffles 19 are attached from the radiation source housing back toward the top of the external housing 2, opposed to the plate 1, for protecting the housing from damage and for avoiding emission of heat to the atmosphere.

As is conventional, the apparatus also comprises features that are not shown, including a supporting frame for the housing 2 which may include a power supply; conduits and sockets for electric connections; motor means for driving the roller pairs; blower means and plenums for circulating cooling air and for exhausting heated air. Alternately, the power supply, and motor means may be situated outside the frame or housing.

Although a preferred embodiment of this invention has been described, many variations and modifications will now be apparent to those skilled in the art, and it is therefore preferred that the instant invention be limited not by the specific disclosure herein, but only by the appended claims.

What is claimed is:

1. A UV curing apparatus for post-curing lithographic plates, or the like, the apparatus comprising:

a UV radiation source; means for moving a lithographic plate, or the like, the plate having two opposite surfaces and at least one of the surfaces should be exposed to UV radiation, with the plate moving along predetermined path, with the plate moving beneath and with one of the surfaces of the plate being spaced from the radiation source as the plate moves past the radiation source;

antibuckling means for preventing buckling of the plate due to radiation from the radiation source impinging on the one surface of the plate, the antibuckling means comprising:

lower antibuckling means spaced from the surface of the plate away from the radiation source for being engaged by that surface of the plate to prevent buckling of the plate;

upper antibuckling means disposed between the radiation source and the one surface of the plate and being spaced from the one surface of the plate for being engaged by that surface of the plate to prevent buckling of the plate; the upper antibuckling means comprising:

a support; a plurality of antibuckling bars suported by the support and normally spaced above the one surface of the plate, and the antibuckling bars being supported by the support at an orientation generally along the path of the plate and obliquely inclined across and with respect to the path of the plate, whereby radiation is not blocked by the antibuckling bars from impinging upon any line along the path of the plate on the one surface of the plate, and the support being shaped and positioned so as to generally avoid blocking radiation from the radiation source from irradiating the one surface of the plate past the antibuckling bars.

2. The UV post-curing apparatus of claim 1, wherein the support comprises a pair of elongated members extending across the plate and across the path of the plate, being spaced from the one surface of the plate and the elongated members being spaced apart along the path of the plate and being positioned out of the path of direct radiation from the radiation source to the plate; the antibuckling bars being attached to the elongated members.

3. The UV post-curing apparatus of claim 2, wherein the radiation source is elongated and extends across the plate and across the path of the plate.

4. The UV post-curing apparatus of claim 3, wherein the elongated members are oriented parallel to the radiation source and the antibuckling bars meet the elongated members at other than 90°.

5. The UV post-curing apparatus of claim 4, wherein the elongated members are perpendicular to the path of the plate.

6. The UV post-curing apparatus of claim 1, wherein the radiation source is elongated and extends across the plate and across the path of the plate.

7. The UV post-curing apparatus of claim 1, wherein the lower anti-buckling means comprises a second support; a second plurality of second antibuckling bars supported by the second support and normally spaced above the surface of the plate which is opposed to the second antibuckling bars.

8. The UV post-curing apparatus of claim 7, wherein at least some of the second bars are oriented to extend along the path of the plate.

9. The UV post-curing apparatus of claim 1, further comprising a UV opaque housing defining a curing chamber; the radiation source and the antibuckling means being positioned within the curing chamber; the moving means being for moving the plate through the curing chamber.

10. The UV post-curing apparatus of claim 9, wherein the housing includes an entrance into and an exit from the housing for the plate to pass through as the moving means moves the plate through the curing chamber.

11. The UV post-curing apparatus of claim 10, wherein the radiation source further comprises a reflector above the radiation source at the side of the radiation source away from the plate and the reflector being aimed for directing UV radiation impinging on the reflector back to the one surface of the plate opposed to the reflector.

12. The UV post-curing apparatus of claim 11, further comprising baffle means between the radiation source and the part of the housing generally above the one surface of the plate opposed to the radiation source.

13. The UV post-curing apparatus of claim 9, wherein the moving means comprises a first pair of vertically displaced generally horizontal rollers for defining a nip through which the plate is moved by the first rollers.

14. The UV post-curing apparatus of claim 13, wherein the moving means further comprises a second pair of vertically displaced generally horizontal rollers, also for defining a nip through which the plate is moved; the first and second pairs of rollers spaced apart along the path of the plate and being at the opposite sides of the area on the one surface of the plate being irradiated by radiation from the radiation source.

15. The UV post-curing apparatus of claim 14, wherein the first pair of rollers is located in the curing chamber at the entrance thereto and the second pair of rollers is located in the curing chamber at the exit therefrom; the rollers of each pair thereof being in light, tight contact with each other and with a plate when a plate is passing between them, and the first and second roller pairs being near enough to the housing entrance and exit, respectively, for blocking emission of radiation through the entrance and the exit.

16. The UV post-curing apparatus of claim 15, wherein each pair of rollers comprises an upper roller above the one surface of the plate and a lower roller at the opposite surface of the plate; a radiation opaque baffle being positioned between the radiation source and each of the upper rollers of the roller pairs.

17. The UV post-curing apparatus of claim 16, wherein a second radiation opaque baffle is positioned between the radiation source and each of the lower rollers of the roller pairs.

18. The UV post-curing apparatus of claim 17, wherein the radiation source further comprises a reflector above the radiation source at the side of the radiation source away from the plate and the reflector being aimed for directing UV radiation impinging on the reflector back to the one surface of the plate opposed to the reflector;

baffle means between the radiation source and the part of the housing generally above the one surface of the plate opposed to the radiation source.

19. The UV post-curing apparatus of claim 15, wherein each pair of rollers comprises an upper roller above the one surface of the plate and a lower roller at the opposite surface of the plate; a radiation opaque baffle being positioned between the radiation source and each of the lower rollers of the roller pairs.

* * * * *